(12) United States Patent
Baba et al.

(10) Patent No.: US 7,839,641 B2
(45) Date of Patent: Nov. 23, 2010

(54) CONDENSER FOR POWER MODULE AND POWER MODULE

(75) Inventors: Youichiro Baba, Toyota (JP); Hideo Nakamura, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 12/297,894

(22) PCT Filed: Feb. 25, 2008

(86) PCT No.: PCT/JP2008/053711
§ 371 (c)(1),
(2), (4) Date: Oct. 21, 2008

(87) PCT Pub. No.: WO2008/142892
PCT Pub. Date: Nov. 27, 2008

(65) Prior Publication Data
US 2010/0170662 A1    Jul. 8, 2010

(30) Foreign Application Priority Data
May 21, 2007    (JP) ............................. 2007-133981

(51) Int. Cl.
*H05K 7/20* (2006.01)
*H01L 23/473* (2006.01)
*F28D 15/00* (2006.01)

(52) U.S. Cl. ................ 361/711; 361/710; 361/717; 361/718; 257/713; 257/714; 257/720; 165/104.19; 165/104.33

(58) Field of Classification Search ................ 361/697, 361/702, 709–711, 717–719, 679.54; 257/713, 257/714, 720; 165/104.19, 104.33
See application file for complete search history.

(56) References Cited

U.S. PATENT DOCUMENTS 4,415,025 A * 11/1983 Horvath ...................... 165/185

(Continued)

FOREIGN PATENT DOCUMENTS

JP          62238653 A * 10/1987

(Continued)

*Primary Examiner*—Anatoly Vortman
(74) *Attorney, Agent, or Firm*—Kenyon & Kenyon LLP

(57) ABSTRACT

A condenser for a power module combines a plurality of aluminum materials to form a casing equipped with a channel for coolant therein, thus making it possible to keep material costs low. Moreover, thanks to the excellent workability of the aluminum materials, it is possible to adopt a configuration with a complex concave-convex configuration for a superior heat radiation performance. A channel for coolant with high heat radiation performance can also be structured inside the casing. The relatively thick bottom plate secures the rigidity required by the casing, while the relatively thin top plate can have a rigidity intentionally structured lower. In this manner, stress generated on joining surfaces of the condenser and an insulative substrate can be mitigated due to active deformation of the top plate.

7 Claims, 7 Drawing Sheets

U.S. PATENT DOCUMENTS

| | | | | |
|---|---|---|---|---|
| 5,006,924 | A * | 4/1991 | Frankeny et al. | 257/714 |
| 6,401,807 | B1 * | 6/2002 | Wyler et al. | 165/121 |
| 6,466,438 | B1 * | 10/2002 | Lim | 361/679.47 |
| 6,765,793 | B2 * | 7/2004 | Kehret et al. | 361/690 |
| 6,798,663 | B1 * | 9/2004 | Rubenstein | 361/710 |
| 6,992,382 | B2 * | 1/2006 | Chrysler et al. | 257/717 |
| 6,992,888 | B1 * | 1/2006 | Iyer | 361/699 |
| 7,017,655 | B2 * | 3/2006 | Wilson et al. | 165/80.4 |
| 7,044,199 | B2 * | 5/2006 | Thayer et al. | 165/80.4 |
| 7,254,030 | B2 * | 8/2007 | Chiba et al. | 361/710 |
| 2001/0033476 | A1 * | 10/2001 | Dibene et al. | 361/702 |
| 2005/0017350 | A1 * | 1/2005 | Corti et al. | 257/706 |
| 2006/0108097 | A1 * | 5/2006 | Hodes et al. | 165/80.4 |
| 2009/0284921 | A1 * | 11/2009 | Colgan et al. | 361/699 |

FOREIGN PATENT DOCUMENTS

| | | |
|---|---|---|
| JP | 2001-077260 A | 3/2001 |
| JP | 2001-148451 A | 5/2001 |
| JP | 2002-078356 A | 3/2002 |
| JP | 2003-086744 A | 3/2003 |
| JP | 2006-032617 A | 2/2006 |
| JP | 2006-294971 A | 10/2006 |

* cited by examiner

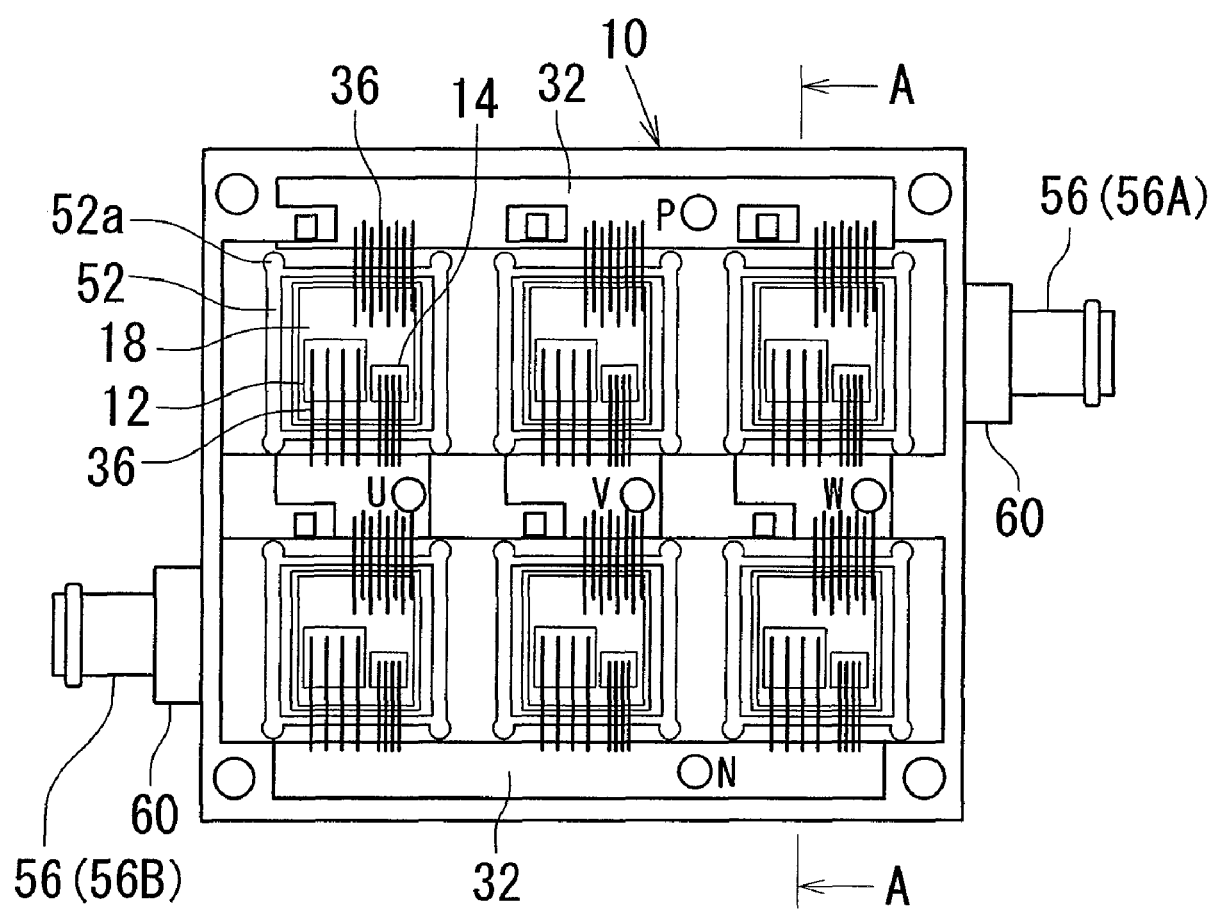
F I G. 2 ured using a single metal such as aluminum. The use of a
CONDENSER FOR POWER MODULE AND POWER MODULE This is a 371 national phase application of PCT/JP2008/053711 filed 25 Feb. 2008, claiming priority to Japanese Patent Application No. JP 2007-133981 filed 21 May 2007, the contents of which are incorporated herein by reference.

TECHNICAL FIELD

The present invention relates to a condenser for a power module and a power module.

BACKGROUND ART

The performance of a power module equipped with a power semiconductor element such as an IGBT can be reduced due to heat generated from conducted electricity. Therefore, an insulative substrate (ceramic-based) mounted with a power semiconductor element is conventionally fixed to a heat sink, condenser, or the like and such cooling means are used to release heat.

However, since the insulative substrate has been directly attached to the condenser in the past, there is stress generated from the difference in the linear expansion coefficients of the condenser and the insulative substrate, which carries the risks of cracks forming in joining boundary surfaces and deformation of the condenser. Current countermeasures include employing a material with a linear expansion coefficient similar to that of the insulative substrate, such as a metal/ceramic composite, for the condenser, and inserting between the condenser and the insulative substrate a buffer layer with a linear coefficient that is a mean of both, such as molybdenum (see Patent Documents 1 and 2 for examples).

Patent Document 1: Japanese Patent Application Publication No. JP-A-2002-78356
Patent Document 2: Japanese Patent Application Publication No. JP-A-2001-77260

DISCLOSURE OF THE INVENTION

Problem to be Solved by the Invention

However, a condenser manufactured using a metal/ceramic composite is extremely expensive due to the special materials involved. For example, such a condenser may cost approximately ten to twenty times more than a condenser manufactured using a single metal such as aluminum. The use of a metal/ceramic composite requires a casting method such as the gravity casting process or the like for processing, which limits shaping flexibility. The adoption of a configuration with a good heat radiation performance such as one provided with a plurality of minute cooling fins is also difficult.

According to the method in which the condenser itself uses an ordinary metal such as copper or aluminum and a buffer layer is inserted between the condenser and the insulative substrate, while it is possible to suppress an increase in manufacturing cost, there are other problems associated with the manufacturing process. For example, in order to join a molybdenum buffer layer with the condenser, it is necessary to heat the entire work to 300° C. or more if a brazing filler metal such as solder is used. Because of the difference in the linear expansion coefficients of the buffer layer and the condenser, after heating and during cooling warpage occurs in the condenser. Warpage of the condenser suggests that there is residual stress on the joining surface and that cracks may appear in the future. In addition, warpage of the condenser can also potentially interfere with the attachment of separate parts to the condenser. Such problems concerning warpage and cracks caused by the difference in the linear expansion coefficients of the buffer layer and the condenser are difficult to avoid, regardless of what kind of material is used for the buffer layer, so long as there is a difference between both linear expansion coefficients.

The present invention was devised in light of the foregoing issues, and it is an object of the present invention to prevent deformation of a condenser and prevent a crack from occurring at joined portions of the condenser and an insulative substrate of a power module, which are caused by a difference in linear expansion coefficients of the condenser and the insulative substrate, while also avoiding an increase in a manufacturing cost of the condenser.

Means for Solving the Problem

In order to resolve the above issues, a condenser for a power module according to the present invention combines a plurality of aluminum materials to form a casing equipped with a channel for coolant therein. Therefore, an increase in material costs can be prevented. Moreover, it is possible to adopt a configuration with a complex concave-convex configuration for a superior heat radiation performance. By adopting a stress relaxation structure for the mitigating stress generated on the joining surfaces of the aluminum material and the insulative substrate, the difference in the linear expansion coefficients of the aluminum material and the insulative substrate can be eliminated.

In addition, a power module according to the present invention fixes the insulative substrate mounted with a power semiconductor element to the condenser, which consequently achieves a low-cost power module with high durability and high heat radiation performance.

Exemplary Form of the Invention

The following form of the invention is an example of the configuration of the present invention, and will be explained in an itemized manner to facilitate understanding of the diverse structures of the present invention. The items do not limit a technical scope of the present invention. Taking into consideration a best mode for carrying out the invention, items with some structural elements replaced, removed, or further including other structural elements can also be included in the technical scope of the invention in the present application.

(1) A condenser for a power module combines a plurality of aluminum materials to form a casing equipped with a channel for coolant therein.

According to the condenser for a power module described in the present item, combining the plurality of aluminum materials forms the casing equipped with the channel for coolant therein. Therefore, material costs can be kept low. Moreover, thanks to the excellent workability of the aluminum materials, it is possible to adopt a configuration with a complex concave-convex configuration for a superior heat radiation performance, and structure a channel for coolant with high heat radiation performance therein.

(2) In the condenser for a power module in item (1), the casing is formed such that a thickness ratio of a top plate and a bottom plate thereof is 1:5 to 10.

According to the condenser for a power module described in the present item, a relatively thick bottom plate secures the rigidity required by the casing, while a relatively thin top plate can have a rigidity intentionally structured lower. In this manner, stress generated on joining surfaces of the condenser and the insulative substrate can be mitigated due to active deformation of the top plate.

(3) In the condenser for a power module in item (1), the top plate of the casing is fixed with a high-purity aluminum block for fixing the power module.

According to the condenser for a power module described in the present item, by fixing the high-purity aluminum block to the top plate and fixing the insulative substrate to the aluminum block, stress generated on the joining surfaces of the condenser and the insulative substrate can be mitigated due to active deformation of the high-purity aluminum block, thanks to the low yield stress characteristic of the high-purity aluminum block.

In order to lower the yield stress of the aluminum block, the aluminum purity is preferably 99.99% or more. Also, the aluminum block should preferably have a thickness that ensures sufficient realization of the stress relaxation effect of the aluminum block. For example, the aluminum block may be formed such that the thickness ratio of the top plate of the casing and the aluminum block is 1:5 to 10.

(4) In the condenser for a power module in item (1), a frame-like projection or depression is formed at a position on the top plate that surrounds the high-purity aluminum block.

According to the condenser for a power module described in the present item, stress concentrates on the frame-like projection or depression formed at a position surrounding the high-purity aluminum block and the frame-like projection or depression actively deforms. Therefore, stress generated on the joining surface of the condenser and the insulative substrate can be mitigated.

(5) In the condenser for a power module in item (1), the channel is divided into a plurality of parallel flow passages by a plurality of cooling fins that extend in a direction perpendicular to a lengthwise direction of an insulative substrate of the power module.

According to the condenser for a power module described in the present item, the plurality of cooling fins provided in the channel increases a surface area of contact with the coolant, which can improve cooling efficiency. In addition, the plurality of cooling fins is disposed so as to extend in a direction perpendicular to the lengthwise direction of the insulative substrate of the power module. Therefore, a reinforcement effect achieved by the rigidity of the cooling fins is not generated in the lengthwise direction of the insulative substrate, which experiences large deformation due to heat stress. On the contrary, stress generated on the joining surfaces of the condenser and the insulative substrate can be absorbed and mitigated by deformation in a width direction of the parallel flow passages divided by the cooling fins.

(6) In the condenser for a power module, a plurality of aluminum materials is combined to form a casing equipped with a channel for coolant therein, the casing is formed such that a thickness ratio of a top plate and a bottom plate thereof is 1:5 to 10, the top plate is fixed with a high-purity aluminum block for fixing the power module, a frame-like projection or depression is formed at a position on the top plate that surrounds the high-purity aluminum block, and the channel is divided into a plurality of parallel flow passages by a plurality of cooling fins that extend in a direction perpendicular to a lengthwise direction of an insulative substrate of the power module.

According to the condenser for a power module described in the present item, combining the plurality of aluminum materials forms the casing equipped with the channel for coolant therein. Therefore, material costs can be kept low. Moreover, thanks to the excellent workability of the aluminum materials, it is possible to adopt a configuration with a complex concave-convex configuration for a superior heat radiation performance, and structure a channel for coolant with high heat radiation performance therein. A relatively thick bottom plate secures the rigidity required by the casing, while a relatively thin top plate can have a rigidity intentionally structured lower. In this manner, stress generated on joining surfaces of the condenser and the insulative substrate can be mitigated due to active deformation of the top plate. By fixing the high-purity aluminum block to the top plate and fixing the insulative substrate to the aluminum block, stress generated on the joining surfaces of the condenser and the insulative substrate can be mitigated due to active deformation of the high-purity aluminum block, thanks to the low yield stress characteristic of the high-purity aluminum block. Stress concentrates on the frame-like projection or depression formed at a position surrounding the high-purity aluminum block and the frame-like projection or depression actively deforms. Therefore, stress generated on the joining surface of the condenser and the insulative substrate can be mitigated. The plurality of cooling fins provided in the channel increases a surface area of contact with the coolant, which can improve cooling efficiency. In addition, the plurality of cooling fins is disposed so as to extend in a direction perpendicular to the lengthwise direction of the insulative substrate of the power module. Therefore, a reinforcement effect achieved by the rigidity of the cooling fins is not generated in the lengthwise direction of the insulative substrate, which experiences large deformation due to heat stress. On the contrary, stress generated on the joining surfaces of the condenser and the insulative substrate can be absorbed and mitigated by deformation in a width direction of the parallel flow passages divided by the cooling fins.

The combination of the stress relaxation effects and cooling efficiency improvement effects obtained by the above structural elements makes it possible to avoid deformation of the condenser and cracks in the joining portions of the condenser and the insulative substrate, whereby a high heat release effect can be realized.

(7) In the condenser for a power module, an intermediate plate is sandwiched between the top plate and the bottom plate to divide the channel into two layers, a top layer and a bottom layer, and each layer is divided into a plurality of parallel flow passages by the cooling fins.

According to the condenser for a power module described in the present item, sandwiching an intermediate plate between the top plate and the bottom plate divides the channel into two layers, a top layer and a bottom layer. The cooling fins are provided in each layer, where a thickness in a height direction has been reduced. Therefore, the entire surface area of the cooling fins is increased, and at the same time, thanks to the cross-sectional shape of the plurality of parallel flow passages for coolant, the flow of coolant can be prevented from backing up in narrow portions. Widening the surface area of portions that actually contribute to heat release, namely improving a so-called fin efficiency, enables the realization of a high heat release effect.

(8) In the condenser for a power module, a plurality of intermediate plates is incorporated in a combined state between the top plate and the bottom plate to form the channel as a flow passage in which a flow direction of coolant doubles back at least once.

According to the condenser for a power module described in the present item, by sandwiching the plurality of intermediate plates in a combined state between the top plate and the bottom plate, the channel is formed as a flow passage in which the flow direction of coolant doubles back at least once.

Therefore, the flow of coolant over the entire condenser is smoothed regardless of the wideness or narrowness of the surface area of the condenser (a surface area of the insulative substrate fixed to the condenser) to enable the realization of a high heat release effect.

(9) In the condenser for a power module, a pipe that serves as a flow inlet and flow outlet for coolant is attached by an aluminum brazing filler metal to the top plate, the bottom plate, the plurality of intermediate plates, the cooling fin, and the insulative substrate.

According to the condenser for a power module described in the present item, the top plate, the bottom plate, the plurality of intermediate plates, the cooling fin, the insulative substrate, and the pipe are all fixed at once through use of the aluminum brazing filler metal.

(10) In the condenser for a power module, the cooling fin has a corrugated sheet configuration formed by folding an aluminum plate, and an apex angle of folded portions thereof is formed so as to be 40° or more.

According to the condenser for a power module described in the present item, since the cooling fin has a corrugated sheet configuration formed by folding an aluminum plate, the cooling fin with a plurality of crests and troughs is an integrated structure. When inspecting for bubble defects (voids) in solder, which is the joining material used to mount the power semiconductor element on an upper surface of the insulative substrate using transmission X-rays, it is possible to prevent defects from being hidden by the shadows of voids and cooling fins by forming the apex angle θ of the folded portions so as to be 40° or more. In other words, a wall of the cooling fin more parallel to an X-ray radiating direction results in a crown portion of the folded portions of the cooling fin casting a more distinct shadow. As a consequence, overlapping of a bubble defect in solder with the shadow of a void increases the possibility of non-detection. Meanwhile, if the apex angle of the folded portions of the cooling fin is 40° or more, a thickness of the cooling fin in a direction that intersects with the X-rays can be reduced, and the defect of a hidden void shadow caused by the shadow of the crown portion of the folded portions of the cooling fin can be avoided.

(11) In the condenser for a power module, the folded portions of the cooling fin are fixed to the top plate, the bottom plate, and the intermediate plate in an offset state so there is no overlap in each of the layers of the channel.

According to the condenser for a power module described in the present item, the folded portions of the cooling fin are fixed to the top plate, the bottom plate, and the intermediate plate in an offset state so there is no overlap in each of the layers of the channel. Therefore, it is possible to avoid overlapping with the shadow of the aluminum brazing filler metal fillet at a portion where the folded portions of the cooling fin contact the top plate, the bottom plate, and the intermediate plate. Accordingly, the defect of the aluminum brazing filler metal fillet casting a distinct shadow and hiding the shadow of a void can be avoided.

(12) In the condenser for a power module, the plurality of intermediate plates is formed with a trough that engages with the folded portions of the cooling fin.

According to the condenser for a power module described in the present item, the intermediate plate is formed with the trough that engages with the folded portions of the cooling fin. Therefore, the folded portions are accurately positioned with respect to the intermediate plate, and an offset state in which the folded portions of the cooling fin do not overlap in each layer of the channel can be reliably achieved. In addition, engaging the trough with the folded portions of the cooling fin increases a contact surface area between the intermediate plate and the cooling fins, making it possible to improve the joining reliability and joining strength of both.

(13) In the power module, the high-purity aluminum block is fixed with an insulative substrate mounted with a power semiconductor element.

According to the power module described in the present item, the insulative substrate mounted with a power semiconductor element is fixed to the condenser described in the above items (1) to (12), which consequently structures a low-cost power module with high durability and high heat radiation performance.

Effects of the Invention

With the present invention structured as described above, it is possible to prevent deformation of a condenser and prevent a crack from occurring at joined portions of the condenser and an insulative substrate of a power module, which are caused by a difference in linear expansion coefficients of the condenser and the insulative substrate, while also avoiding an increase in a manufacturing cost of the condenser.

BRIEF DESCRIPTION OF THE DRAWINGS

FIG. 2 is a plane view showing a specific example of the power module according to the embodiment of the present invention;

Figure 1:
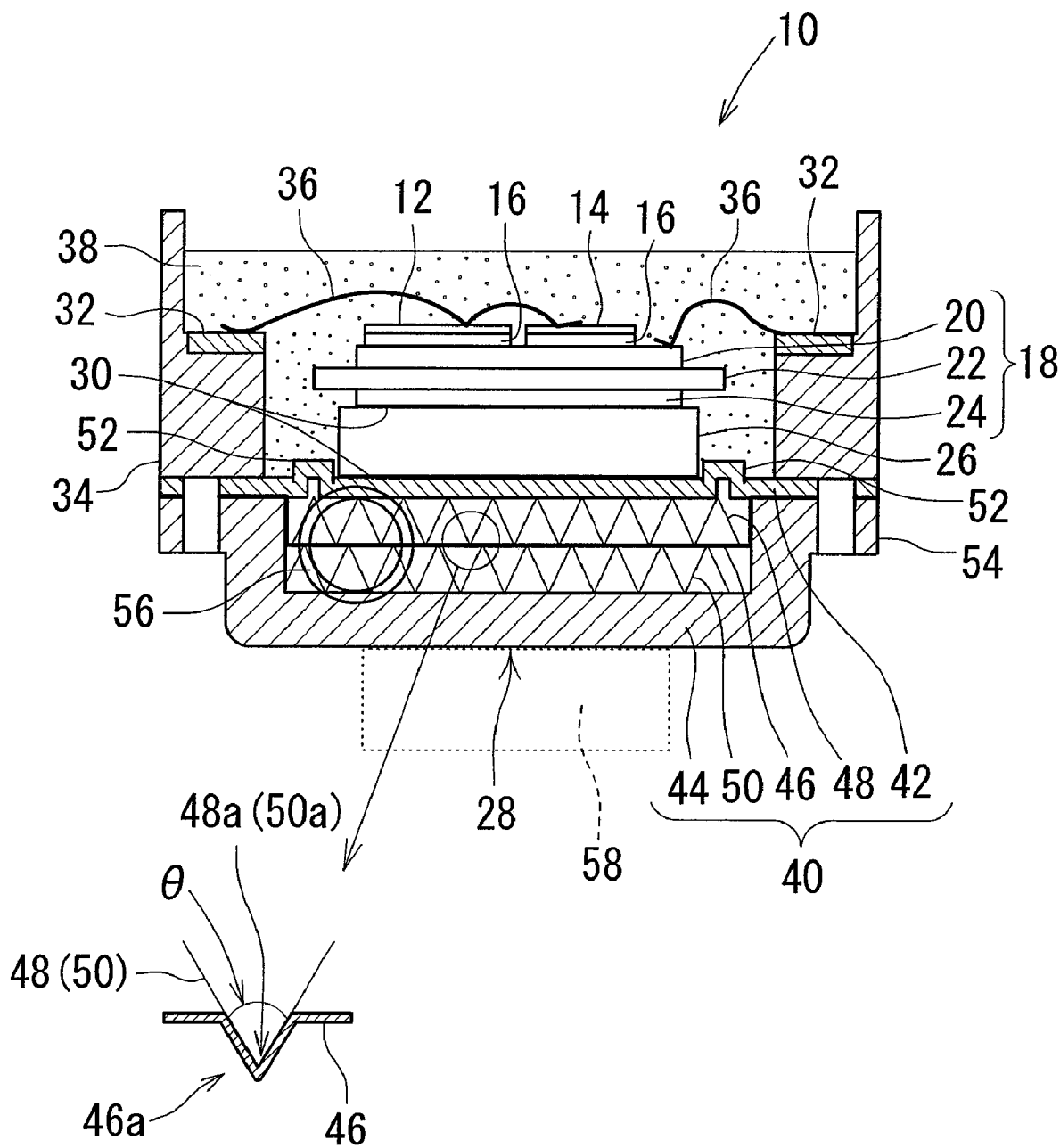
FIG. 1 is a cross-sectional view schematically showing a basic structure of a power module according to an embodiment of the present invention.

| Description of the Reference Numerals | |
|---|---|
| 10 | POWER MODULE |
| 12 | IGBT |
| 14 | DIODE |
| 16 | SOLDER |
| 18 | INSULATIVE SUBSTRATE |
| 26 | HIGH-PURITY ALUMINUM BLOCK |
| 28 | CONDENSER |
| 30 | BOND |
| 40 | CASING |
| 42 | TOP PLATE |
| 44 | BOTTOM PLATE |
| 46, 46A, 46B | INTERMEDIATE PLATE |
| 48, 50 | COOLING FIN |
| 52 | FRAME-LIKE PROJECTION OR DEPRESSION |
| 56 | PIPE |

BEST MODES FOR CARRYING OUT THE INVENTION

Hereinafter, best modes for carrying out the present invention will be described with reference to the accompanying drawings. Note that like reference numerals are assigned to portions that are identical or correspond to that of related art, and such portions are not explained in detail.

A power module 10 according to an embodiment of the present invention has the basic structure shown in FIG. 1. An IGBT 12 and a diode 14 are fixed to an insulative substrate 18 via solder 16. The insulative substrate 18 has a three-layered structure in which an upper surface of a thin ceramic plate 22 is formed with a conductive wiring layer 20 and a lower surface of the thin ceramic plate 22 is formed with a joining layer 24. It should be noted that the conductive wiring layer 20 and the joining layer 24 are both formed from a thin aluminum plate, and a surface of the conductive wiring layer 20 has nickel plating. The insulative substrate 18 is fixed to a condenser 28 via a high-purity aluminum block 26. The high-purity aluminum block 26 preferably has an aluminum purity of 99.99% or more for reasons that will be explained later. In addition, an aluminum brazing filler metal is used for a joining material 30 between the insulative substrate 18, the high-purity aluminum block 26, and the condenser 28. A resin housing 34 equipped with a bus bar 32 surrounds the insulative substrate 18 and the high-purity aluminum block 26, and is fixed to an upper surface of the condenser 28 using a silicon-based adhesive. Furthermore, the bus bar 32, the IGBT 12, the diode 14, and the conductive wiring layer 20 are all electrically connected by an aluminum wire 36, and an interior space of the resin housing 34 is filled with a silicon gel 38.

The condenser 28 combines a plurality of aluminum materials to form a casing 40 equipped with a channel for coolant therein. The casing 40 consists of the structural members of a top plate 42, a bottom plate 44, an intermediate plate 46, and cooling fins 48, 50. These structural members are all made of aluminum and are press-molded parts in the example shown in the figure.

The top plate 42 and the bottom plate 44 are formed so as to have a thickness ratio of 1:5 to 10. The high-purity aluminum block 26 is fixed with the top plate 42. A position at which the top plate 42 surrounds the high-purity aluminum block 26 is formed with a frame-like projection or depression 52. In addition, the bottom plate 44 is shaped as a lidless box whose outer peripheral portion is formed with a seat portion 54 for mounting the top plate 42 and the intermediate plate 46. The bottom plate 44 is also fixed with a pipe 56 that serves as a flow inlet and flow outlet for coolant. A lower surface of the bottom plate 44 is flat so that it may be used as a fixing surface for a heat radiating part 58 (such as a DC-DC inverter and a reactor). The heat radiating part 58 is fixed to the lower surface of the bottom plate 44 via grease. Note that as an example of the thickness ratio of respective structural parts of the casing 40, if a thickness $t_{48,50}$ of the cooling fins 48, 50 is 1, then a thickness $t_{46}$ of the intermediate plate 46 is 4, a thickness $t_{42}$ of the top plate 42 is 8, a thickness $t_{44}$ of the bottom plate 44 is 80, and a thickness $t_{26}$ of the aluminum block 26 is 80.

By sandwiching the intermediate plate 46 between the top plate 42 and the bottom plate 44, the channel of coolant is divided into two layers, a top layer and a bottom layer, and the cooling fins 48, 50 are provided in both layers. The cooling fins 48, 50 have a corrugated sheet configuration formed by folding an aluminum sheet, and wave-like folded portions (ridge lines) 48a, 50a are integratedly formed as cooling fins with a plurality of crests and troughs that extend in a direction perpendicular to a lengthwise direction of the insulative substrate 18. It should be noted that a structure divided into more layers can be adopted as necessary. By contacting and fixing the folded portions 48a, 50a with the top plate 42, the bottom plate 44, and the intermediate plate 46, the channel of the coolant is divided into a plurality of parallel flow passages. Moreover, as an enlarged portion in FIG. 1 illustrates, the intermediate plate 46 is formed with a trough 46a that engages with the folded portions 48a, 50a, of the cooling fins 48, 50.

Note that, for reasons to be explained later, an apex angle θ of the folded portions 48a, 50a is formed so as to be 40° or more. Furthermore, the folded portions 48a, 50a of the cooling fins 48, 50 are fixed to the top plate 42, the bottom plate 44, and the intermediate plate 46 in an offset state so there is no overlap in each of the layers of the channel.

Figure 3:
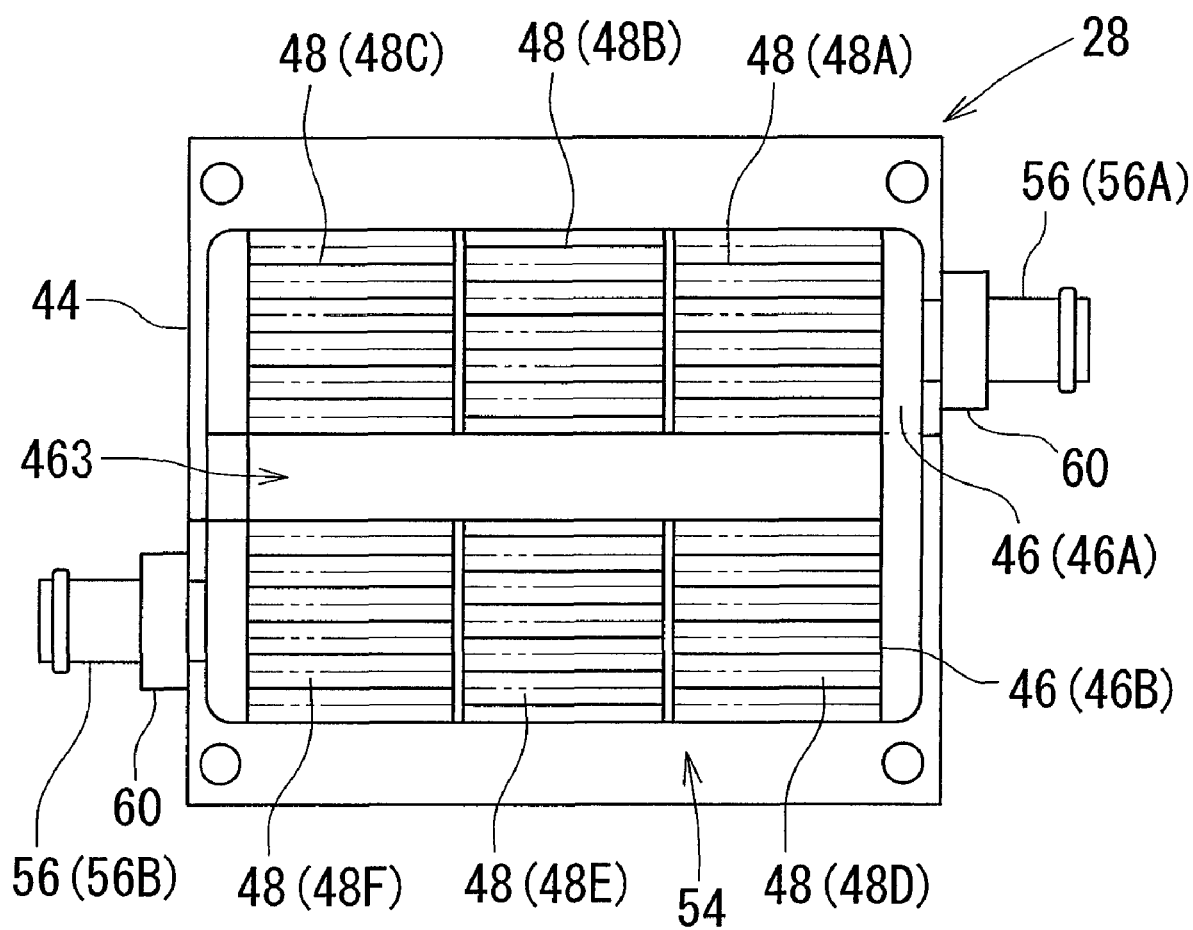
FIG. 3 is a plane view showing a state of the power module shown in FIG. 2 with structural components positioned above a top plate removed.
Figure 4A:
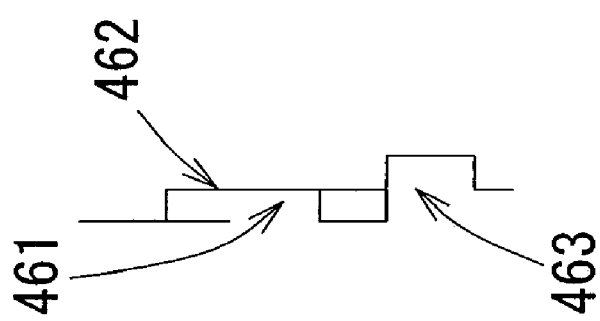
FIG. 4 is a view of a single intermediate plate of the power module shown in FIG. 2, where (a) is a back view, (b) is a left side view, (c) is a plane view, and (d) is a right side view.
Figure 4C:
Figure 4C:
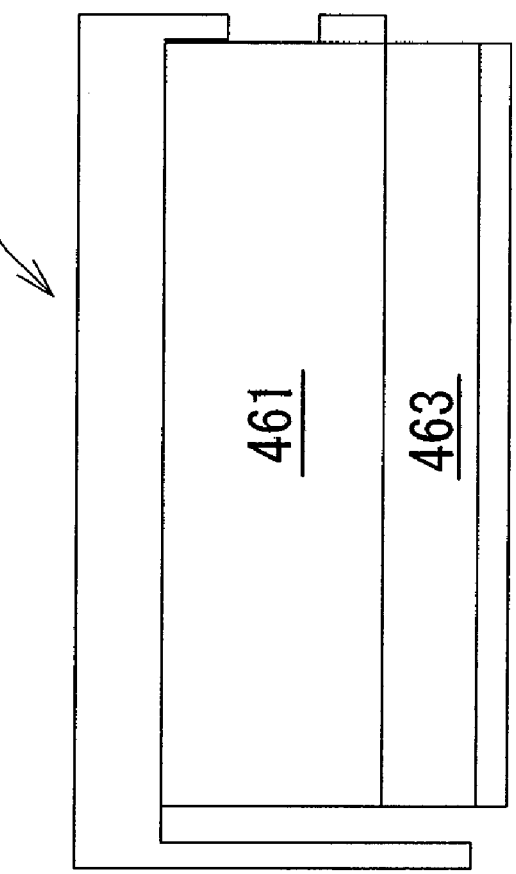
Figure 4B:
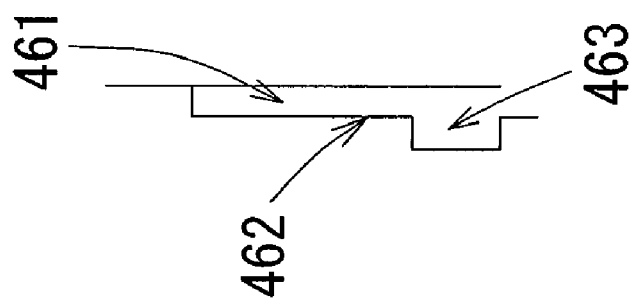
Figure 5C:
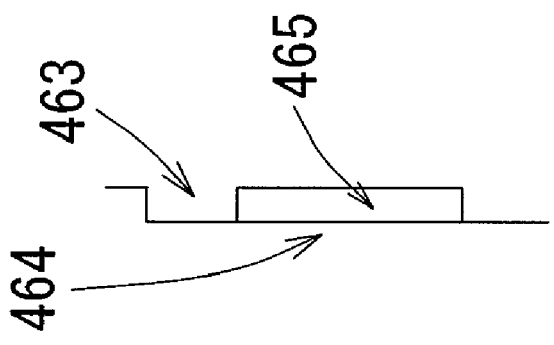
FIG. 5 is a view of another single intermediate plate of the power module shown in FIG. 2, where (a) is a left side view, (b) is a plane view, (c) is a right side view, and (d) is a front view.
Figure 5B:
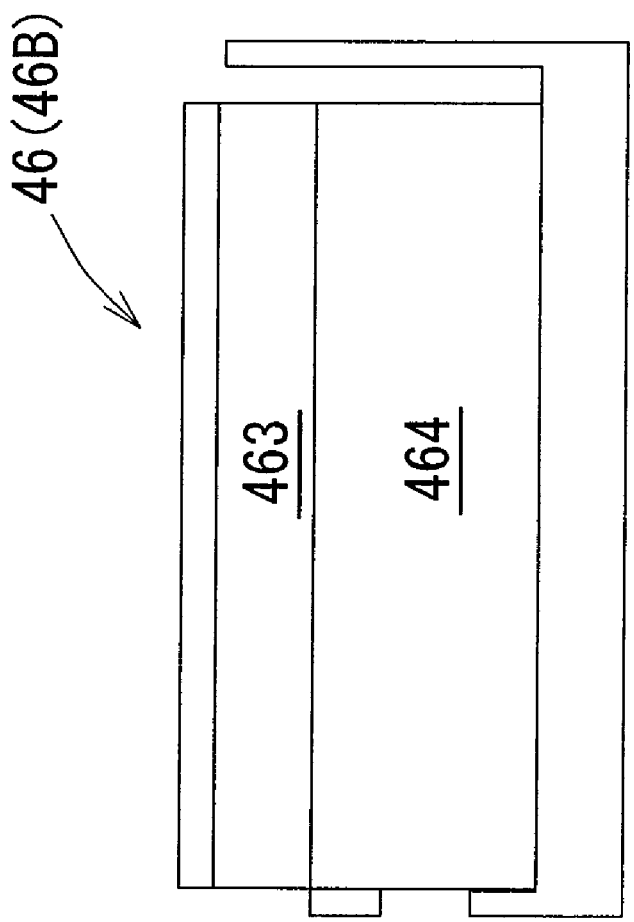
Figure 5D:
Figure 5A:
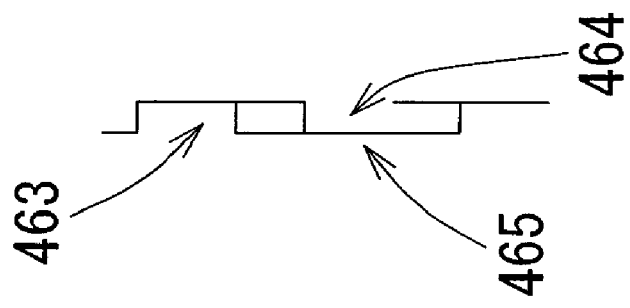

FIG. 2 shows a plane view of a specific example of the power module 10 according to the embodiment of the present invention. The specific example of FIG. 2 includes six insulative substrates 18 (element blocks) that are mounted with the IGBT 12 and the diode 14. Such a configuration is a motor drive circuit generally known as a 6-in-1. In addition, FIG. 3 shows a state of the power module 10 shown in FIG. 2 with structural components positioned above the top plate 42 (see FIG. 1) removed. Both end portions facing the bottom plate 44 are fixed via a cylindrical flange 60 with a pipe 56 (56A) and a pipe 56 (56B) that serve as a flow inlet and a flow outlet of coolant, respectively. By incorporating the intermediate plate 46 between the top plate 42 and the bottom plate 44 in a state where two intermediate plates 46A, 46B are combined as shown in FIGS. 4 and 5, the channel is formed as a flow passage in which the flow direction of coolant doubles back at least once.

Figure 6:
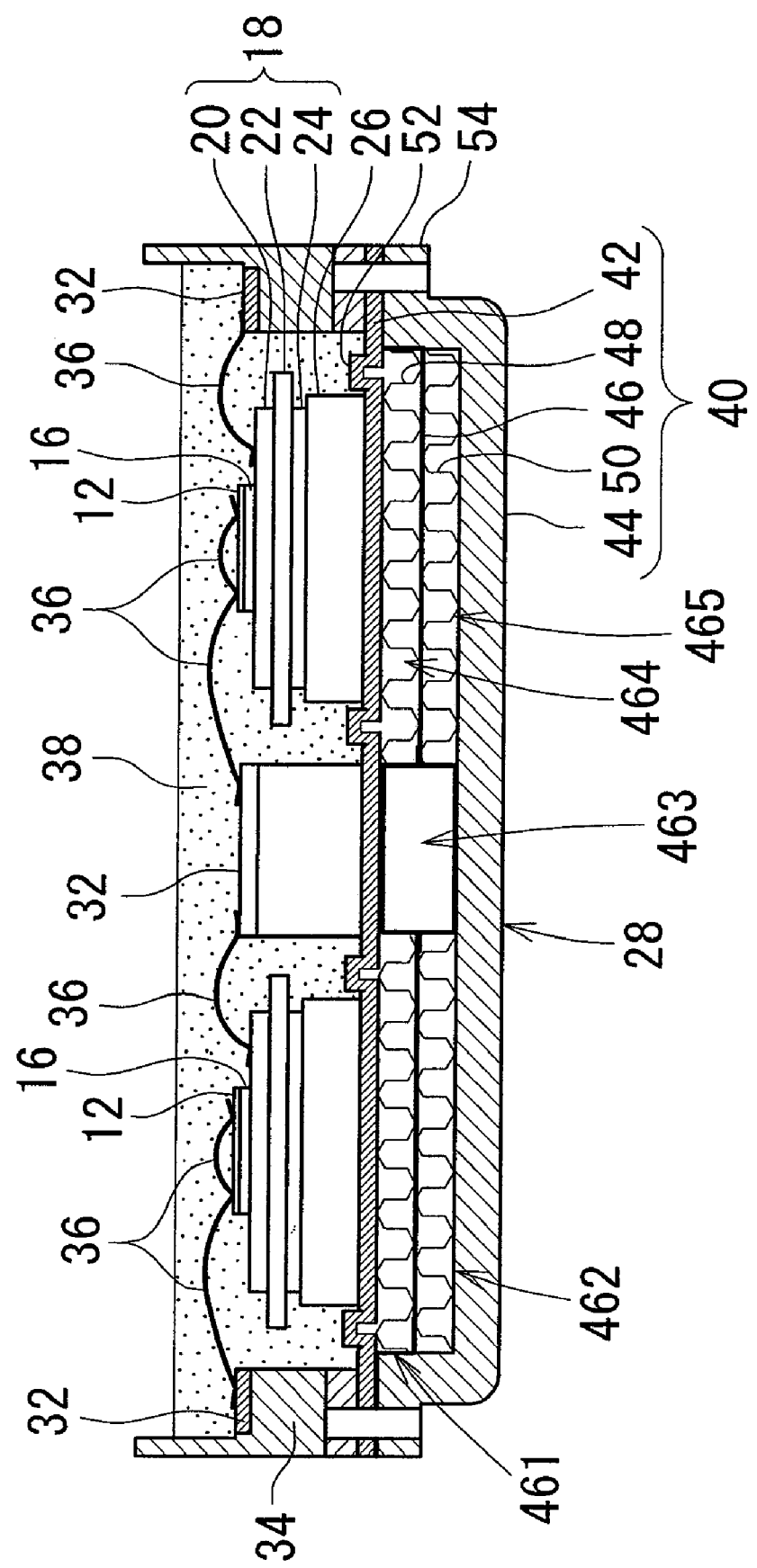
FIG. 6 is a cross-sectional view taken along a line A-A in FIG. 2.

Specifically, by vertically overlapping a portion denoted by reference numeral 463 in FIGS. 4 and 5, a one-layered flow passage is formed in a center portion as shown in FIG. 6. Both sides of the one-layered flow passage are formed with portions denoted by reference numerals 461, 462, 464, 465 in FIGS. 4 to 5, whereby a two-layered flow passage having a top layer and a bottom layer is formed. The one-layered flow passage of the center portion does not directly contribute to cooling of the element blocks, and is provided for the purpose of doubling back the flow of coolant. Note that in the present embodiment, the two intermediate plates 46A, 46B have identical shapes and are used combined so as to face away from one another.

As the plane view of FIG. 3 shows, the cooling fin 48 is divided among the six element blocks. A plurality of parallel flow passages is formed by cooling fins 48A, 48B, 48C, 48D, 48E, 48F of the blocks, and arranged staggered (in a zigzag configuration) such that adjacent blocks are not aligned on a straight line. In this manner, the flow of other parallel flow passages can be secured even if a portion of the passages becomes blocked.

The route of the coolant flowing inside the condenser 28 according to the specific example of FIG. 2 is as follows. In FIG. 3, coolant first flows into the condenser 28 from the pipe 56A, and flows from right to left in FIG. 3 through the portions denoted by cooling fins 48A, 48B, 48C (at this time, the coolant flows through the top and bottom layers). Next, the flow of coolant doubles back from left to right in FIG. 3 due to the center flow passage 463, and then the coolant flows from right to left in FIG. 3 through the portions denoted by cooling fins 48D, 48E, 48F (at this time, the coolant flows through the top and bottom layers). Thereafter, the coolant is discharged from the pipe 56B.

Effects obtained by the embodiment of the present invention with the above structure are as follows. The condenser 28 of the power module according to the embodiment of the present invention combines a plurality of aluminum materials 42, 44, 46, 48, 50 to form the casing 40 equipped with a channel for coolant therein. Therefore, material costs can be kept low. Moreover, thanks to the excellent workability of the aluminum materials, it is possible to adopt a configuration with a complex concave-convex configuration for a superior heat radiation performance and structure a channel for coolant with high heat radiation performance inside the casing 40. Also note that the plurality of cooling fins 48, 50 provided in the channel increases a surface area of contact with the coolant, which can improve cooling efficiency as well.

The relatively thick bottom plate 44 secures the rigidity required by the casing 40, while the relatively thin top plate 42 can have a rigidity intentionally structured lower. In this manner, stress generated on joining surfaces of the condenser 28 and the insulative substrate 18 can be mitigated due to active deformation of the top plate 42.

By fixing the high-purity aluminum block 26 to the top plate 42 and fixing the insulative substrate 18 to the aluminum block 26, stress generated on the joining surfaces of the condenser 28 and the insulative substrate 18 can be mitigated due to active deformation of the high-purity aluminum block 26, thanks to the low yield stress characteristic of the high-purity aluminum block 26. Accordingly, a lower yield stress characteristic can be expected from the use of an aluminum block 26 with higher aluminum purity. Stress concentrates on the frame-like projection or depression 52 formed at a position surrounding the high-purity aluminum block 26 and the frame-like projection or depression 52 actively deforms. Therefore, stress generated on the joining surface of the condenser 28 and the insulative substrate 18 can be mitigated. In addition, the plurality of cooling fins 48, 50 is disposed so as to extend in a direction perpendicular to the lengthwise direction of the insulative substrate 18 of the power module 10. Therefore, a reinforcement effect achieved by the rigidity of the cooling fins 48, 50 is not generated in the lengthwise direction of the insulative substrate 18, which experiences large deformation due to heat stress. On the contrary, stress generated on the joining surfaces of the condenser 28 and the insulative substrate 18 can be absorbed and mitigated by deformation in a width direction of the parallel flow passages divided by the cooling fins 48, 50.

The combination of the stress relaxation effects and cooling efficiency improvement effects obtained by the above structural elements makes it possible to avoid deformation of the condenser 28 and cracks in the joining portions of the condenser 28 and the insulative substrate 18, whereby a high heat release effect can be realized.

Note that the condenser 28 according to the embodiment of the present invention has no risk of deformation, and therefore, the lower surface of the bottom plate 44 can be used as a fixing surface for the heat radiating part 58 (such as a DC-DC inverter and a reactor).

In the condenser 28 of the power module according to the embodiment of the present invention, by sandwiching the intermediate plate 46 between the top plate 42 and the bottom plate 44, the channel is divided into two or more layers consisting of a top layer and a bottom layer, and the cooling fins 48, 50 are provided in each layer, where a thickness in a height direction has been reduced. Therefore, the entire surface area of the cooling fins 48, 50 is increased, and at the same time, thanks to the cross-sectional shape of the plurality of parallel flow passages for coolant, narrow portions where the flow of coolant may back up can be eliminated (the cross-sectional shape of the flow passages in the example of FIG. 1 approaches the shape of an equilateral triangle). Widening the surface area of portions that actually contribute to heat release, namely improving a so-called fin efficiency, enables the realization of a high heat release effect.

Furthermore, in the condenser 28 for the power module according to the embodiment of the present invention, by sandwiching the two intermediate plates 46A, 46B in a combined state between the top plate 42 and the bottom plate 44, the channel is formed as a flow passage in which the flow direction of coolant doubles back in a Z configuration in a plane view (see FIG. 3). Therefore, the incorporation of a plurality of element blocks, such as with the condenser for a motor drive circuit known as a 6-in-1 shown in FIG. 2, smoothes the flow of coolant over the entire condenser 28 regardless of the wideness or narrowness of the surface area, even in cases of an increased surface area of the condenser 28 (a surface area of the insulative substrate 18 fixed to the condenser) to enable the realization of a high heat release effect.

In the condenser 28 for the power module according to the embodiment of the present invention, an aluminum plate is bent and shaped so as to have a wave configuration, whereby the cooling fins 48, 50 are integratedly formed having a plurality of crests and troughs. When inspecting for bubble defects (voids) in solder, which is the joining material used to mount the power semiconductor element on an upper surface of the insulative substrate using transmission X-rays, it is possible to prevent defects from being hidden by the shadows of voids and cooling fins by forming the apex angle θ of the folded portions 48a, 50a so as to be 40° or more.

Figure 7:
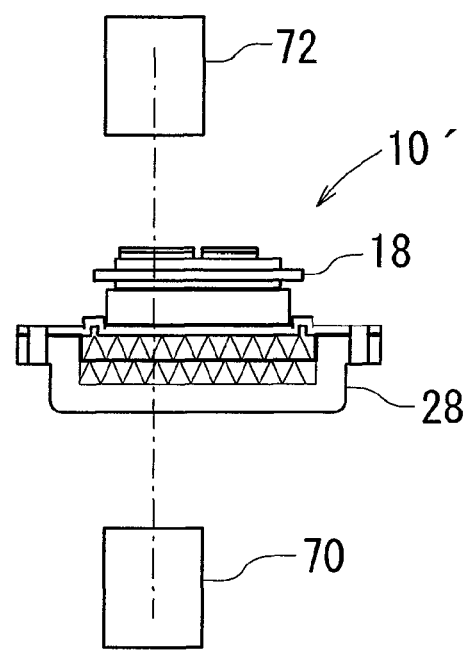
FIG. 7 is a schematic structural view of an inspection device for an aluminum brazing filler solder quality of the power module according to the embodiment of the present invention.
Figure 8:
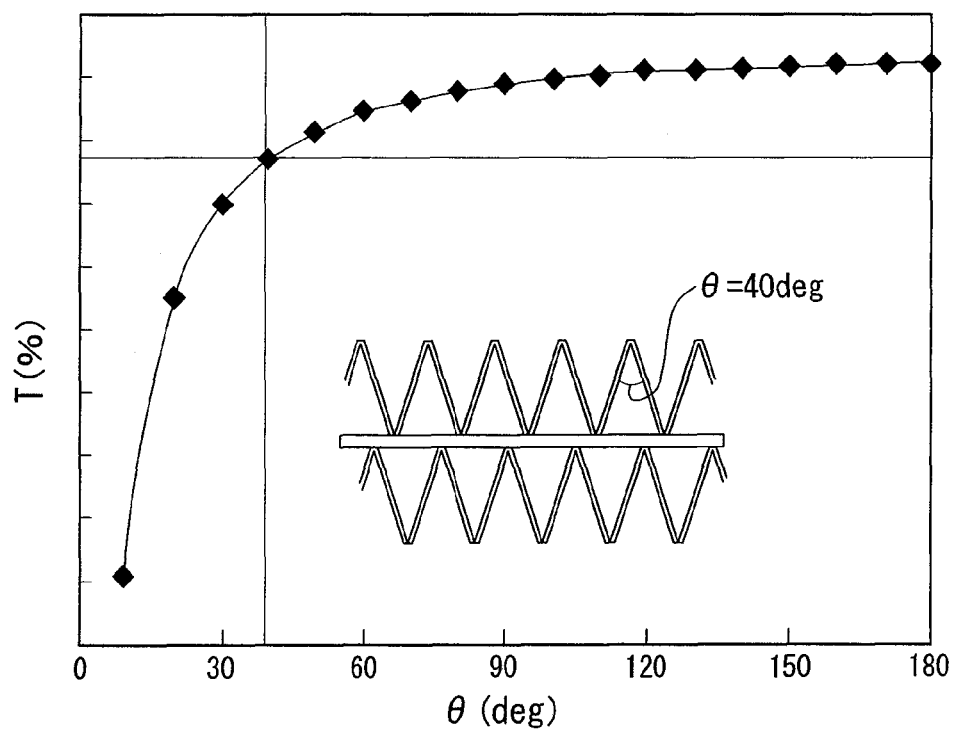
FIG. 8 was obtained based on the inspection device in FIG. 7, and is a graph showing a relationship between an apex angle of a folded portion of a cooling fin and X-ray transmittance.

Here, as shown in FIG. 7, for the inspection of power module solder quality (voids), an X-ray generator 70 and an imaging device 72 are arranged so as to sandwich a half-completed power module 10' where the joining of the condenser 28 and the insulative substrate 18 is finished. A void transfer imaging is thus achieved by radiating X-rays in a direction perpendicular to the insulative substrate 18. Therefore, a wall of the cooling fins 48, 50 more parallel to an X-ray radiating direction results in a crown portion of the folded portions 48a, 50a of the cooling fins 48, 50 casting a more distinct shadow. As a consequence, overlapping of such a shadow with the shadow of a void increases the possibility of non-detection. Meanwhile, if the apex angle of the folded portions 48a, 50a of the cooling fins 48, 50 is 40° or more as in the embodiment of the present invention, a thickness of the cooling fins 48, 50 in a direction that intersects with the X-rays can be reduced, and the defect of a hidden void shadow can be avoided as explained above. FIG. 8 shows a relationship between an X-ray transmittance T and the apex angle θ of the folded portion of the cooling fin in the power module 10', as verified by the inventors. As evident in this figure, an apex angle θ less than 40° is clearly associated with a sudden drop in the X-ray transmittance T.

In the condenser 28 for the power module according to the embodiment of the present invention, the folded portions 48a, 50a of the cooling fins 48, 50 are fixed to the top plate 42, the bottom plate 44, and the intermediate plate 46 in an offset state so there is no overlap in each of the layers of the channel. Therefore, it is possible to avoid overlapping with the shadow of the aluminum brazing filler metal at a portion where the folded portions 48a, 50a of the cooling fins 48, 50 contact the top plate 42, the bottom plate 44, and the intermediate plate 46. Accordingly, the defect of the aluminum brazing filler metal casting a distinct shadow and hiding the shadow of a void can be avoided.

Moreover, in the condenser 28 for the power module according to the embodiment of the present invention, the intermediate plate 46 is surely formed with the trough 46a that engages with the folded portions 48a, 50a, of the cooling fins 48, 50. Therefore, the folded portions 48a, 50a are positioned with respect to the intermediate plate 46, and an offset state in which the folded portions 48a, 50a of the cooling fins 48, 50 do not overlap in each layer of the channel can be reliably achieved. In addition, engaging the trough 46a with the folded portions 48a, 50a of the cooling fins 48, 50 increases a contact surface area between the intermediate plate 46 and the cooling fins 48, 50, making it possible to improve the joining reliability and joining strength of both.

Accordingly, by fixing the insulative substrate 18 mounted with the power semiconductor element 12 to the condenser 28, the power module 10 according to the embodiment of the present invention becomes a low-cost power module with high durability and high heat radiation performance.

The invention claimed is:

1. A condenser for a power module wherein
a plurality of aluminum materials is combined to form a casing equipped with a channel for coolant therein,
the casing is formed such that a thickness ratio of a top plate and a bottom plate thereof is 1:5 to 10,
the top plate is fixed with a high-purity aluminum block for fixing the power module,
one of a frame-like projection and depression is formed at a position on the top plate that surrounds the high-purity aluminum block, and
the channel is divided into a plurality of parallel flow passages by a plurality of cooling fins that extend in a direction perpendicular to a lengthwise direction of an insulative substrate of the power module.

2. The condenser for a power module according to claim 1, wherein
an intermediate plate is sandwiched between the top plate and the bottom plate to divide the channel into at least two layers, and each layer is divided into a plurality of parallel flow passages by the cooling fins.

3. The condenser for a power module according to claim 2 wherein a plurality of intermediate plates is incorporated in a combined state between the top plate and the bottom plate to form the channel as a flow passage in which a flow direction of coolant doubles back at least once.

4. The condenser for a power module according to claim 3, wherein the cooling fin has a corrugated sheet configuration formed by folding an aluminum plate, and an apex angle of folded portions thereof is formed so as to be 40° or more.

5. The condenser for a power module according to claim 4, wherein the folded portions of the cooling fin are fixed to the top plate, the bottom plate, and the intermediate plate in an offset state so there is no overlap in each of the layers of the channel.

6. The condenser for a power module according to claim 4 wherein the plurality of intermediate plates is formed with a trough that engages with the folded portions of the cooling fin.

7. The condenser for a power module according to claim 1, wherein
the power module is constructed so that the high-purity aluminum block is fixed with an insulative substrate mounted with a power semiconductor element.

* * * * *